United States Patent [19]

Morimoto

[11] 4,450,460
[45] May 22, 1984

[54] MAGNETIC-INFRARED-EMITTING DIODE
[75] Inventor: Takeshi Morimoto, Kyoto, Japan
[73] Assignee: Kyoto University, Kyoto, Japan
[21] Appl. No.: 305,218
[22] Filed: Sep. 24, 1981
[30] Foreign Application Priority Data
  Sep. 25, 1980 [JP] Japan ................. 55-132279
[51] Int. Cl.³ ............................... H01L 33/00
[52] U.S. Cl. ........................ 357/17; 357/29; 357/19; 357/61; 372/43
[58] Field of Search .......... 357/27, 30, 17, 19, 357/61; 372/43
[56] References Cited
  U.S. PATENT DOCUMENTS
  3,167,663  1/1965  Melngailis ............. 357/27
  4,170,781 10/1979  Cox ...................... 357/61
  4,273,596  6/1981  Gutierrez ............. 357/61

Primary Examiner—Martin H. Edlow
Attorney, Agent, or Firm—Fleit, Jacobson, Cohn & Price

[57] ABSTRACT

A plate of a semiconductor having a narrow energy gap such as InSb, is applied with a magnetic field in parallel therewith and further supplied with a current in parallel therewith also as well as across the magnetic field, whereby an infrared radiation can be emitted perpendicular thereto in a wide range of temperature from room temperature to liquid nitrogen temperature.

Consequently, an infrared emitting device, for instance, an infrared laser diode can be fabricated and operated at room temperature without necessity of a dewar filled with refrigerating material such as liquid nitrogen. Various kinds of compact infrared-emitting equipments such as an infrared radar can be realized by modulating the current supplied to the above infrared emitting device.

10 Claims, 11 Drawing Figures

MAGNETIC-INFRARED-EMITTING DIODE

BACKGROUND OF THE INVENTION (1) Field of the Invention:

The present invention relates to a magneto-infrared-emitting diode or an infrared laser diode, particularly being operated satisfactorily at the room temperature.

(2) Description of the Prior Art:

The infrared emission having a wavelength ranging from 2 to 15 μm is widely utilized in the industries, particularly in the military use. The conventional principle of the operation of the light-emitting diode or the solid-state laser diode operating at the above wavelengths is based on the recombination radiation of excess electrons and holes, whose concentrations deviate remarkably from the thermal equilibrium values, injected in a narrow-gap semiconductor, such as InSb, by passing high current to the p-n junction formed on the semiconductor.

Concretely speaking, as shown in FIG. 1, a p-n junction 1 is formed at a central portion of a semiconductor plate consisting of, for instance, InSb by diffusing p-type and n-type impurities respectively into both end portions of the semiconductor plate. In a situation where the above semiconductor plate is refrigerated at temperatures as low as 77° K. by liquid nitrogen, the radiation 5 having a wavelength of middle-infrared (from 2 to 15 μm), which is emitted from a surface of the semiconductor plate by the recombination of excess electrons 3 and excess holes 4 injected into the p-n junction 1, can be obtained.

However, generally speaking, a relation expressed by the following equation can be found between the wavelength λ μm of the light emitted by the recombination of pairs of electron-holes and the energy gap Eg eV of the semiconductor in which the recombination of those pairs is taking place;

$$\lambda(\mu m) = 1.24/Eg \text{ (eV)}.$$

So that, a narrow energy gap, which does not exceed substantially 0.6 eV, e.g., 0.18 eV for InSb semiconductor, is required for the semiconductors to obtain the infrared emission of wavelengths from 2 to 15 μm. Besides, in order to keep the extrinsic p-type and n-type properties in such narrow-gap semiconductors, it is also required to refrigerate them at temperatures as low as 77° K. by the use of liquid nitrogen. Whilst, at room temperature, the extrinsic narrow-gap semiconductors, which have p-n junction at lower temperatures, revert immediately to the intrinsic state, so that the recombinations radiation could scarely be expected.

Accordingly, the conventional infrared-emitting diode or the conventional infrared laser diode, in which the recombination radiation of pairs of electron-holes at the p-n junction is utilized, has such serious defects for practical use as required to be operated in the situation where those diodes are refrigerated at extremely low temperatures in a dewar filled with liquid nitrogen and the like, and hence the structure of the emitting apparatus is complicated, expensive, and moreover extremely inconvenient for handling.

SUMMARY OF THE INVENTION

An object of the present invention is to remove the above mentioned serious defects.

Another object of the present invention is to provide a magneto-infrared-emitting diode or an infrared laser diode which can be operated satisfactorily at room temperature, and hence for which a large dewar is no longer required together with refrigerating matrials such as liquid nitrogen.

Moreover, the other object of the present invention is to provide an infrared emitting apparatus having small size and light weight from which such inconveniences for practical use as supplying the refrigerating materials and the like can be removed, so as to facilitate the utilization thereof for various purposes.

The feature of the present invention is that a magneto-infrared-emitting diode is basically formed of an intrinsic semiconductor plate equipped with no injection electrode of minority carriers and being fabricated from a semiconductor having a narrow energy gap which does not exceed substantially 0.6 eV, on which a magnetic field is applied in parallel with surfaces thereof, and to which a current is passed in parallel with those surfaces across the applied magnetic field, so as to emit an infrared radiation of a wavelength greater than 2.1 micrometers in a direction being substantially vertical to those surfaces in the temperature range between 77 and 300 degrees °K. and, in particular, at room temperature.

The present invention will be further explained in detail by referring to the accompanied drawings.

DESCRIPTION OF THE PREFERRED EMBODIMENTS

Firstly, the outline of the principle of operation of the magneto-infrared-emitting diode according to the present invention will be explained by referring to FIG. 2.

Figure 2:
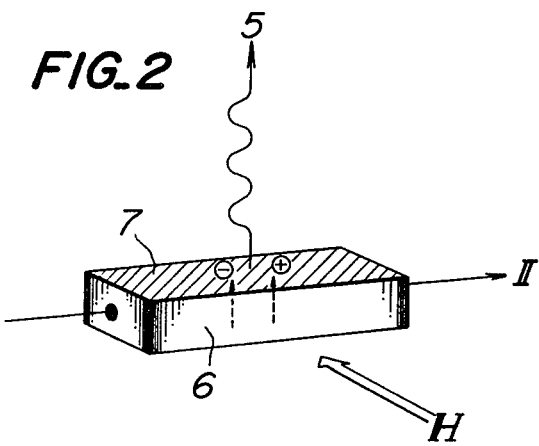
FIG. 2 is a perspective view showing schematically a basic structure of an infrared-emitting diode according to the present invention.

In FIG. 2, a thin plate 6 of an intrinsic semiconductor having a narrow energy gap, which consists, for instance, of the aforesaid InSb and the like, is supplied with a current I in the direction of the length thereof and a magnetic field H in parallel with surfaces thereof across the current perpendicularly.

Consequently, electrons ⊖ and holes ⊕ in the semiconductor plate are swept together along the direction perpendicular to both of the current I and the magnetic field H, namely, to the direction of I×IH due to the interaction between the current I and the magnetic field H. As a result thereof, the concentrations of electrons and holes near the light-emitting surface which is indicated by shadowing in FIG. 2 are increased deviating from the thermal equilibrium values, so that the excess electrons and holes are extinguished by the recombination therebetween near the light-emitting surface, so as to reduce those increased concentrations to the respective initial values; the direct transition between the conductive and valence bands is caused by the recombination of electrons and holes. For example, in direct-transition type semiconductors such as the aforesaid InSb, excess electrons and excess holes existing near the light-emitting surface are extinguished by the infrared emission from the light-emitting surface, which is associated with the direct recombination therebetween and so it has a wavelength $\lambda_o$ corresponding to the energy gap being expressed by the following equation relating the energy gap Eg, the light velocity c and the Plank's constant h; $\lambda_o \cong c \cdot h/Eg$. Whilst, near another surface of the semiconductor plate, which is opposite to the light emitting surface, electrons and holes are newly generated by absorbing the phonon energy of the crystal lattice bivration, so as to continue the above mentioned emission process stationarily. Besides, it is preferable for increasing the rate of the recombination of electrons and holes near the light emitting surface to perform such a surface treatment as sand-blasting.

The infrared radiation having the wavelength from 5.3 μm to 6 μm can be obtained from the aforesaid InSb semiconductor having an energy gap of 0.18 eV, as well as infrared radiations having desired wavelengths can be obtained from other kinds of semiconductors having similarly narrow energy gaps, for instance, $Hg_{1-x}Cd_xTe$, $Pb_{1-x}Sn_xTe$, $Pb_{1-x}Sn_xSe$, $Bi_{1-x}Sb_x$ and others as shown in the following Table 1, by appropriately selecting the component composition ratio x of those semiconductors.

TABLE 1

| Semiconductor | Composition ratio | Energy gap | Wavelength |
|---|---|---|---|
| $Hg_{1-x}Cd_xTe$ | $0.15 < x \leq 0.5$ | | |
| | x = 0.15 | >0 | |
| | x = 0.2 | 0.1 eV | 12.4 μm |
| | x = 0.4 | 0.5 eV | 2.5 μm |
| | x = 0.5 | 0.6 eV | 2.1 μm |
| $Pb_{1-x}Sn_xTe$ | $0 \leq x \leq 1$ | | |
| | x = 0.4 | 0 | |
| | x = 0 | 0.18 eV | 6.9 μm |
| | x = 1 | 0.3 eV | 4.1 μm |
| $Pb_{1-x}Sn_xSe$ | $0 \leq x \leq 0.5$ | | |
| | x = 0 | 0.26 eV | 4.8 μm |
| $Bi_{1-x}Sb_x$ | $0.08 \leq x \leq 0.22$ | | |
| | x = 0.08 | 0 | |
| | x = 0.22 | 0.05 eV | 24.8 μm |
| In As | | 0.36 eV | 3.4 μm |

Moreover, in the situation where an excellent parallelism is kept between the light-emitting surface and the opposite surface of the semiconductor plate and high current is supplied therethrough, the induced infrared emission can be increased so as to obtain a strong laser oscillation.

Besides, either of n-type and p-type semiconductors can be employed as the semiconductor materials according to the above mentioned principle, since such an essential property of the intrinsic semiconductor as electrons and holes coexist in the intrinsic region thereof is utilized for the above principle of operation.

Next, the magneto-infrared-emitting diode according to the present invention, the outline of which is given as mentioned above, will be further described in detail regarding the principle of operation thereof.

Figure 1:
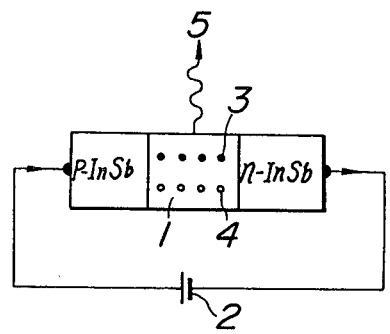
FIG. 1 is a diagram showing schematically an example of a conventional p-n junction type infrared laser diode.

Nonlinear infrared emission from an n-type InSb semiconductor having a central wavelength, $\lambda_o$, nearly corresponding to the direct energy gap, $\lambda_o \cong c \cdot h/(Eg+k \cdot T)$, where c is the light velocity, h is Plank's constant, Eg is the value of the direct energy gap, k is the Boltzmann constant and T is the absolute temperature, has been observed firstly by the present inventor in the temperature range from 80° to 300° K. This emission phenomenon is orignated from the recombination radiation of pairs of excess electrons and holes which are produced by the action of the electromagnetic force J×H as shown in FIG. 1, and can be utilized for realizing a magneto-infrared-emitting diode or an infrared laser diode which can be operated at room temperature.

It is well known from various literatures that the carrier lifetime of InSb crystals is limited by the radiative recombination at high temperatures such as room temperature. However, in this respect, the above-mentioned electromagnetically excited infrared emission from the n-type InSb semiconductor subjected to a magnetic field is essentially different from the well known far-infrared cyclotron emission at lower temperatures.

Regarding the above, let us first consider an intrinsic narrow gap semiconductor plate, such as InSb and $Hg_{1-x}Cd_xTe$ plates, which has a thickness d being much larger than the carrier diffusion length in which a current J is passing along the longer edge thereof, that is, in the x-direction across a magnetic field H applied along the shorter edge, that is, the Z-direction, as shown in FIG. 2. In this intrinsic semiconductor plate situated substantially at room temperature, there are nearly equal numbers $n_o$ and $p_o$ of electrons and holes, namely, $n_o \cong p_o$ in the thermal equilibrium state, and further the applied electromagnetic force J×H produces a collective flow of electrons and holes to the −y-direction as shown by the dotted lines in FIG. 2, which can exceed the original charge flow along the x-direction, when $\omega_c \cdot \tau > 1$, $\omega_c$ and $\tau$ being the cyclotron frequency and the relaxation time respectively.

On the other hand, it can be considered that the electromagnetic force J×H which acts on a particle i having an electric charge $q^{(i)} = \pm |e|$, more strictly speaking, the Lorentz force $F_y^{(i)}$ which is given by the following equation (1);

$$F_y^{(i)} = q^{(i)}\left(E_y + \frac{1}{c} \cdot V_x^{(i)} \cdot H\right), \quad (1)$$

where $v_x^{(i)}$ is the x-component of the drift velocity of particle i, will shift the band edge energy so as to reduce apparent value of the direct energy gap $E_g$ by $-\Delta\epsilon^{(i)} = -F_y^{(i)} \cdot y$ at a point y being apart by distance $|y|$ from a surface, and hence the electron concentration n(y) at a point y will be expressed as $$n(y) = N_c \exp[-(E_c - \xi \Delta\epsilon^{(e)})/kT] \quad (2)$$

$$= n_o \exp(\Delta\epsilon^{(e)}/kT),$$

where $N_c$ is the effective density of states in the conduction band, $E_c$ the energy at the bottom of the conduction band, $\xi$ the Fermi level, k the Boltzmann constant, T the temperature, and $n_o=n(0)$ the electron concentration assumed to be in thermal equilibrium value at $y=0$. The similar expression holds for hole concentration p(y), so that the product will be expressed as $$n(y) \cdot p(y) = N_c N_v \exp[-(Eg - \Delta\epsilon)/kT] \quad (3)$$
$$= n_o p_o \exp(\Delta\epsilon/kT),$$

with $$\Delta\epsilon = \Delta\epsilon^{(e)} + \Delta\epsilon^{(h)} = (F_y^{(e)} + F_y^{(h)}) \cdot y \quad (4)$$
$$\simeq J^{(e)}H \cdot |y|/c \cdot n_o + J^{(e)}H \cdot |y|/c \cdot p_o$$
$$\simeq JH \cdot |y|/c \cdot n_o,$$

if the contribution from the Hall electric field $E_y$ is neglected. Here, $N_v$ is the effective density of states in the valence band, and indices e and h denote electrons and holes, respectively.

In the state of thermal equilibrium, the carrier concentrations $n_o$ and $p_o$ are connected with the intrinsic carrier concentration $n_i$ by the relation, $n_o p_o=(n_i)^2$. However, the carrier population is drastically varied by the influence of the electromagnetic force $J \times H$ particularly in the vicinity of one surface at which $y=-d$, and, as a result thereof, the inversion of the population is caused as expressed by the following equation (5);

$$n \cdot p > (n_i)^2 \quad (5).$$

Accordingly, near the surface of the intrinsic semiconductor plate, the radiative recombination of the pairs of excess electrons and holes must be taking place at the rate $R_c$ per unit time and volume as expressed by the following equation (6);

$$R_c = B \cdot n \cdot p = \frac{n \cdot p}{(n_i)^2} R, \quad (6)$$

with $$R = B(n_i)^2 \quad (7),$$

where R is the rate of the radiative recombination in the state of thermal equilibrium and B is the probability of the radiative recombination, a typical value of which is evaluated to be substantially $4 \times 10^{-11}$ cm$^3$/sec for the InSb semiconductor plate at the temperature of 300° K.

On the other hand, in the stationary state, the generation of pairs of electrons and holes is effected by the absorption of the lattice vibration quanta, that is, the phonons and the re-absorption of a part of emitted photons in the vicinity of the other surface opposite to the above surface, at which $y=0$, and, as a result thereof, the process of emission is continued.

Next, when the carrier distribution is taken into account, the above emission can be considered to have a central wavelength $\lambda_o$ as expressed by the following equation (8);

$$\lambda_o \simeq c \cdot h/(Eg+k \cdot T) \quad (8),$$

where c is the light velocity, h is Plank's constant, Eg is the energy gap, k is the Boltzmann constant and T is the absolute temperature.

It is to be noticed hereupon that, as is apparent from the above equations (3), (4) and (6), the rate, $R_c$, of the radiative recombination can be expressed by the following equation (9), which is similar to that expressing the rectification by a diode;

$$R_c = R \cdot \exp(\Delta\epsilon/kT) \quad (9)$$
$$\simeq R \cdot \exp(\gamma \cdot J \cdot H/kT),$$

together with $\gamma \simeq |y|/(c \cdot n_o)$, so that the linear relationship can be expected in respect to the product (J·H) only when $\Delta\epsilon << kT$.

On the other hand, the value of the probability B of the radiative recombination is too small for indirect-transition type semiconductors such as Ge and Si, whilst a large value thereof can be expected for narrow-gap semiconductors, since they have a large amount of matrix elements for the direct transition.

Figure 3:
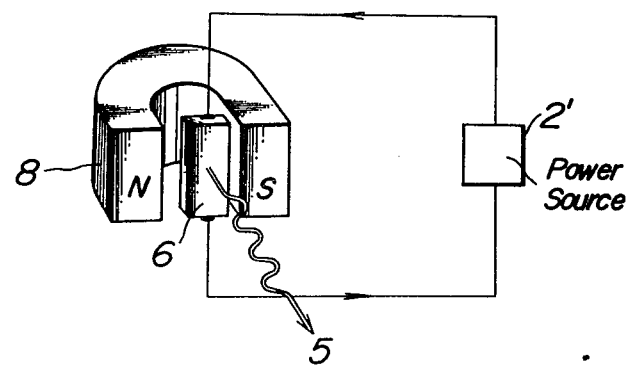
FIG. 3 is a perspective view showing schematically an outline of structure of an infrared emitting apparatus according to the present invention.

Next, an example of structure of an infrared emitting apparatus provided with the above mentioned magneto-infrared-emitting diode which is operated according to the principle of the present invention is shown schematically in FIG. 3. In this example, a narrow-gap intrinsic semiconductor plate 6 consisting, for instance, of InSb, $Hg_{1-x}Cd_xTe$ and the like is fixed between poles N and S of a small-sized permanent magnet 8 generating a magnetic field of an intensity, for instance, from 10 to 20 thousands gausses, and is supplied with a dc, an ac or a pulse current from an external power source 2' through ohmic contact electrodes fitted on both ends thereof, so as to obtain a continuous, an alternately modulated or a pulse-shaped infrared radiation 5 having a wavelength $\lambda \simeq c \cdot h/Eg$. So that, for example, when an amplified audio output of a microphone is used for the external power source 2', an infrared radiation modulated by the audio output can be obtained. The various kinds of narrow-gap semiconductors as shown in Table 1 can be naturally employed for the semiconductor plate 6.

Results of experiments on the magneto-infrared-emitting diode according to the present invention which is mounted on the above apparatus will be roughly explained prior to the detailed description thereof.

Figure 4:
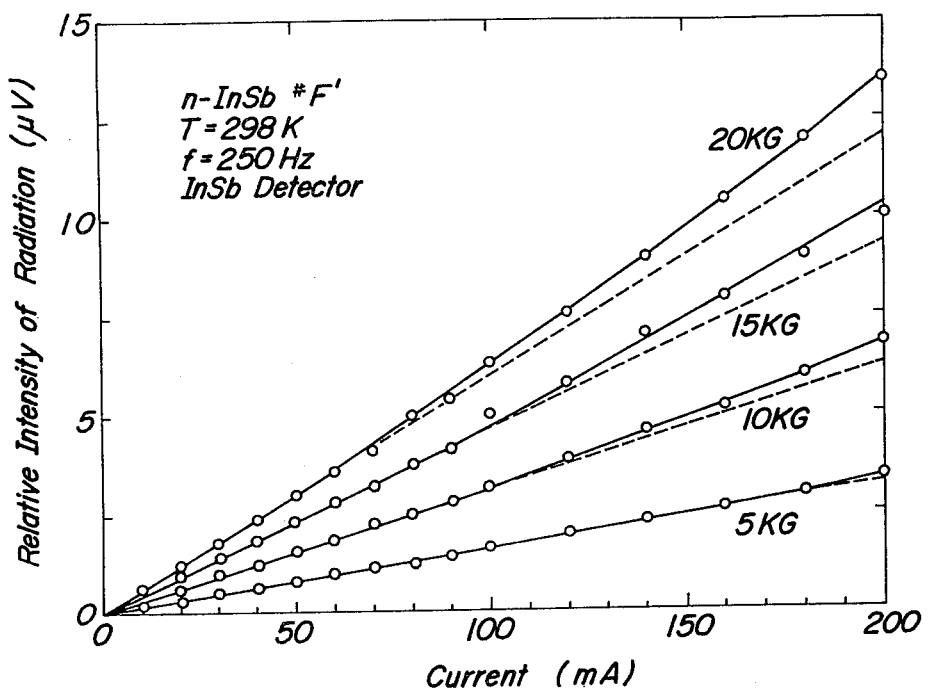
FIGS. 4 and 5 are diagrams showing characteristic curves respectively representing examples of a performance of operation of the infrared emitting apparatus according to the present invention.

FIG. 4 shows an example of the performance of infrared emission obtained as results of experiments on an n-type InSb semiconductor at room temperature, that is, the current dependency of the relative intensity of infrared radiation from the material applied with magnetic fields having various intensities, H=5, 10, 15 and 20 kG, respectively in a situation where an alternate current having a frequency of f=250 Hz is supplied thereto. As is apparent from the above results as shown in FIG. 4, the intensity of the infrared radiation is proportional to the current intensity I and the magnetic field intensity H in a range of small values thereof, whilst non-linear performances of the infrared radiation missing the linear relation between those intensities are observed in the range of larger values thereof. The above relative intensity of the infrared radiation was obtained by synchronously rectifying an output voltage of an InSb infrared detector of photo-voltaic type.

Figure 5:
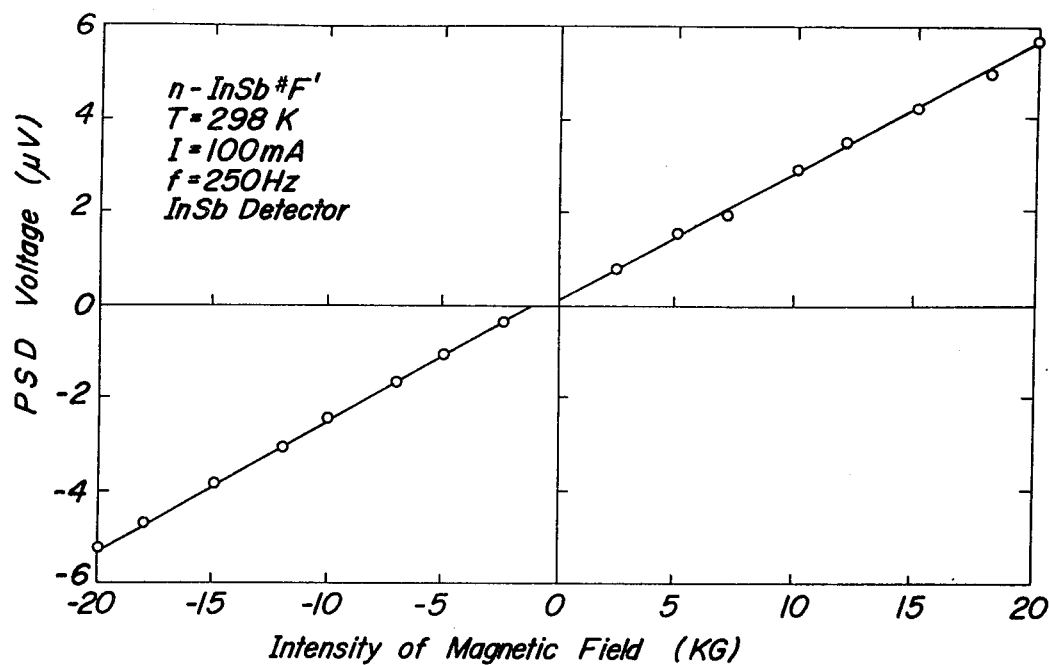

As a result thereof, when the polarity of the magnetic field applied on the material is inverted, the polarity of the synchronously rectified output voltage is inverted in response to the inversion of the phase of the infrared radiation, as shown in FIG. 5.

Figure 7:
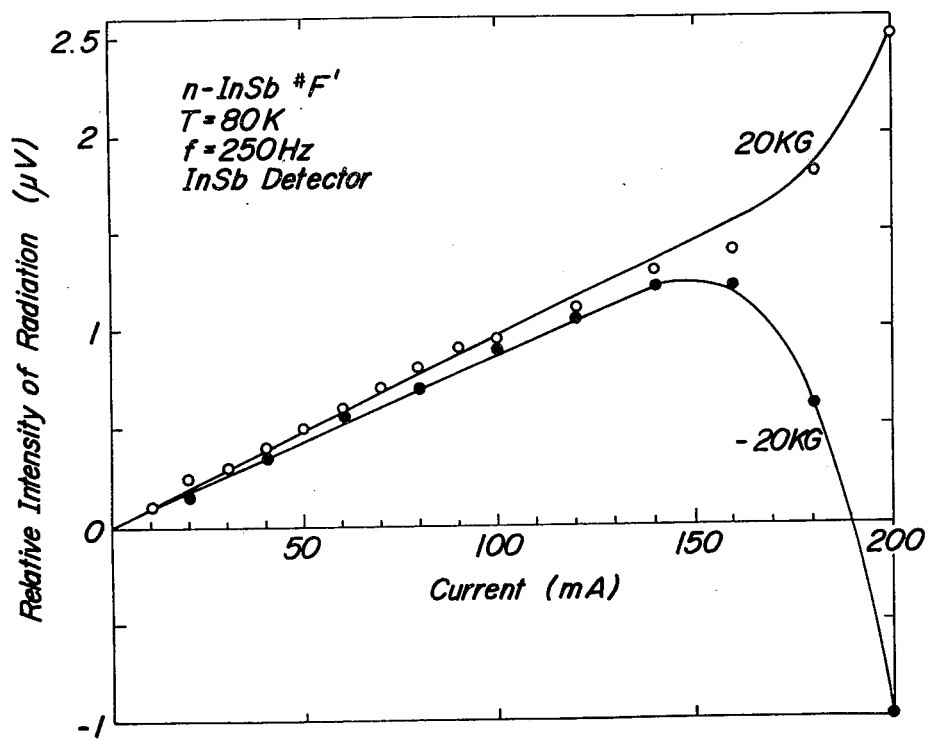
FIG. 7 is a diagram showing characteristic curves respectively representing other examples of the performance of operation of the infrared emitting apparatus according to the present invention.

FIG. 7 shows another example of the performance of infrared radiation as results of experiments on the same n-type InSb semiconductor at liquid nitrogen temperature. As is apparent from the above results as shown in FIG. 7, the nonlinearity of the performance is increased in response to the increase of the current intensity supplied to the material, and further the phase of the infrared radiation is inverted abruptly in response to the inversion of the polarity of the magnetic field applied on the material.

Further describing in detail regarding the above roughly explained experimental results, the above mentioned experiments were carried out by employing n-type InSb crystals from which an infrared emission having the wavelength substantially of 5.3 μm could be expected. The dimensions of the typical sample #F' thereof are 14.86 mm long along the <111> direction, 4.0 mm wide along the <110> direction and 0.88 mm thick along the <211> direction. The values of various kinds of transport parameters thereof, namely, the Hall coefficient $R_H$, the resistivity $\rho_o$, the electron concentration $n_o$ and the mobility $\mu$ are listed in Table 2.

TABLE 2

| T(K) | $R_H$ (cm³/C) | $\rho_o$(Ωcm) | $\mu$(cm²/V·sec) | $n_o$(cm³) |
|---|---|---|---|---|
| 77 | 1.247 × 10³ | 7.49 × 10⁻³ | 1.66 × 10⁵ | 5 × 10¹⁵ |
| 294 | 2.63 × 10² | 4.10 × 10⁻³ | 6.41 × 10⁴ | 2.38 × 10¹⁶ |

The light-emitting surface of the above sample was slightly polished by a #4/0 emery paper for increasing the surface recombination velocity after etching the rapped surface of the sample by a cp-4A solution. Current leads formed of silver wires having a diameter of 0.1 mm were spot-welded on end surfaces thereof by means of capacitor discharging. Moreover, both of end portions of the light-emitting surface were masked by black tapes for preventing the inclusion of possible injection emissions of light near the contact areas of the above current leads.

The sample formed as mentioned above was mounted in a standard metal dewar provided with a Ge window having a diameter of 9 mm, which is used for a 5.3 μm band pass filter, through which the emission was carried into an infrared detector mounted in another dewar which was separated therefrom and connected thereto through a light pipe having a length of 50 cm and an inner diameter of 10 mm. An alternate current up to 200 mA having a frequency of 250 Hz was supplied to the sample along the <111> direction across a magnetic field applied thereon along the <110> direction by an electromagnet. The infrared radiation emitted from the surface of the sample was detected by using the above narrow-band infrared detector, namely, the photovoltaic type InSb detector being operated at 80° K. in the range of wavelength from 2 to 5.7 μm and having the maximum spectral detectivity $$D^* = 1.3 \times 10^{11} \text{ cm·Hz}^{\frac{1}{2}} \cdot W^{-1}$$

at 5.2 μm. The photosignal derived from the InSb detector, which was modulated at a frequency 250 Hz, was further synchronously rectified by means of the phase sensitive detection, namely, the so-called PSD method using a lock-in amplifier of, for instance, PAR Model 124A/116 type which was operated in a differential mode at an input impedance of 50Ω. The PSD voltage obtained as mentioned above, which corresponds to the quantity ($R_c - R$) as derived from equation (9) and could be regarded as the relative intensity of radiation, was recorded as functions of the total current intensity I and the magnetic field intensity H.

As is apparent from FIG. 4, which is the characteristic curves of the infrared emission intensity vs. the current intensity at room temperature under the application of transverse magnetic fields of intensities H=5, 10, 15 and 20 kG, these curves indicate the linear dependence on the electromagnetic force (I×H) in a range of smaller values thereof, whilst the deviations from the linear relation as shown by the dotted lines in FIG. 4 are observed in a range of larger values thereof. The photosignals passed through a band-pass filter having a quality factor of Q=50 indicate a good signal to noise ratio as high as 20.

As described earlier, FIG. 5 shows the magnetic field dependence of the detector signal obtained for the sample which is supplied with a current of intensity I=100 mA at room temperature. The inversion of polarity of the PSD voltage associated with the inversion of polarity of the applied magnetic field, as shown in FIG. 5, means that the phase of the emitted light is inverted also by 180°. This phase inversion of the emitted light is caused by the phase inversion of the concentrations of excess electrons and holes near the light-emitting surface, which are modulated by the electromagnetic force J×H at a frequency of 250 Hz, in association with the inversion of the polarity of the applied magnetic field.

The above experimental results indicate apparently that the remarkable radiative recombination of the pairs of electrons and holes is caused at or near the light-emitting surface. Moreover, in view of the fact that the narrow-band InSb detector was used for the above experiments, it may be also apparent that the emitted light has a wavelength of about 5.3 μm as suggested by equation (8).

Figure 6A:
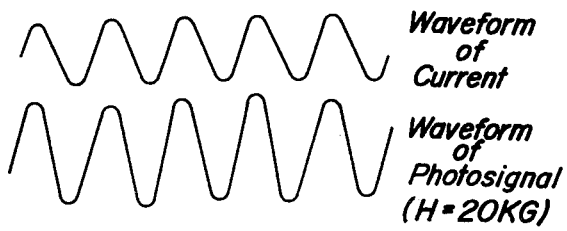
FIGS. 6(a) and 6(b) are diagrams showing waveforms respectively representing examples of the performance of operation of the infrared-emitting apparatus according to the present invention.
Figure 6B:
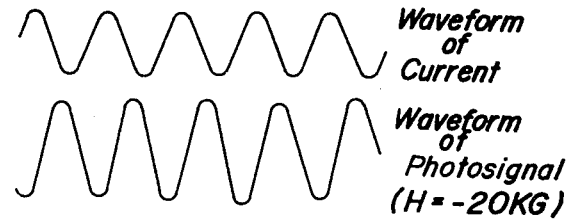

For the purpose of certifying the above phase inversion of the emitted light, a current having a sinusoidal waveform, for instance, of a frequency 250 Hz, as shown on upperside of FIG. 6(a), was supplied to the sample from the external power source 2' in the magneto-infrared-emitting apparatus constructed as shown in FIG. 3, so as to obtain the photosignal being in phase with the sinusoidal waveform of the current as shown on lowerside of FIG. 6(a). In this situation, the phase of the photosignal could be inverted substantially by 180° opposite to that of the sinusoidal waveform of the current, as shown in FIG. 6(b), by means of inverting the polarity of the applied magnetic field.

As described earlier, FIG. 7 shows the characteristic curves of the PSD voltage of the photosignal vs. the supplied current in the situation where the transverse magnetic fields of intensities H=20 kG and H=−20 kG are respectively applied at temperature of 80° K. As is apparent from these curves, at low temperatures, the inversion of sign of the light detection output signal and the remarkable nonlinear emission as suggested by equation (9) can be observed in the lower region of the supplied current. These experimental results can be regarded to indicate that the considerable infrared emission is still taking place at low temperatures, since the contribution of the exponential term in equation (9) is significant, although the value, $(n_i)^2$, of the intrinsic charge carriers is small at low temperatures.

On the other hand, at low temperatures, the response of the photosignals to the inversion of polarity of the applied magnetic field differs from that of the room temperature sample. Accordingly, this may suggest the necessity of taking into account such other factors as the recombination center mechanism, which has been suggested by Schockley and Read and analyzed by Zitter et al, as well as the possibility of the minority carrier injection caused by the Lorentz force from the p-type inversion layer may be existing at the light-emitting surface.

As is apparent from the above investigation, no current oscillations have been observed at a relatively low current densities as examined here. However, regarding the above mentioned experimental results, the negative conduction and the phenomena related closely thereto in the InSb semiconductor must be taken into consideration from the viewpoint of the activity arising from the nonequilibrium state which is caused by application of high magnetic fields, although the details thereof may be problems for further investigation.

Furthermore, it is to be noticed regarding the above experimental results that, as far as electrons and holes coexist, the infrared emission from the InSb semiconductor material at room temperature is so accurate and so strong enough to insure the possibility for realizing a magneto-infrared-emitting diode or an infrared laser diode which can be operated at room temperature, as well as the conventional operation thereof at low temperatures such as liquid nitrogen temperature is satisfactorily insured.

In the magneto-infrared-emitting diode according to the present invention, as mentioned above, infrared radiations having various wavelengths can be emitted therefrom by appropriately selecting the component composition ratio of semiconductors having narrow energy gaps, which are employed to compose the above diode, and infrared radiations of intensities modulated in various manners can be obtained by modulating the currents supplied through semiconductor plates. As a result thereof, various kinds of infrared equipments such as the noctovision, the infrared communication equipment and others can be small-sized and light-weighted by applying the above diode according to the present invention.

Some examples of those infrared equipments as suited for applying the above diode thereto will be described as follows.

(a) Infrared Communication Equipment

The infrared radiations having wavelengths from 8 to 14 $\mu$m are not so much attenuated in the atmosphere, so that these infrared radiations have been utilized for the satellite communication, the wireless communication between ground stations and the like, and further $CO_2$ gas laser having a wavelength of 10.6 $\mu$m is experimentally used at present as a strong laser source. However, regarding the gas laser, it is in general extremely complicated and difficult to modulate it in response to an audio current which is indispensable for the wireless communication, particularly, for the wireless telephone.

In contrast therewith, regarding the magneto-infrared-emitting diode of the present invention, the intensity modulation of the infrared radiation emitted therefrom can be effected so simply and easily only by superposing the audio current upon the current which is supplied to the semiconductor element thereof, and further a strong infrared radiation having a wavelength of substantially 12.4 $\mu$m can be emitted from the semiconductor material of the same kind consisting of $Hg_{1-x}Cd_xTe$ having the composition ratio $x \simeq 0.2$, so that the above diode according to the present invention can be employed for the source of the light communication in place of the conventional $CO_2$ gas laser. Besides, an infrared detector formed of the same semiconductor material can be used for detecting the infrared radiation which is transmitted for the light communication.

Figure 8:
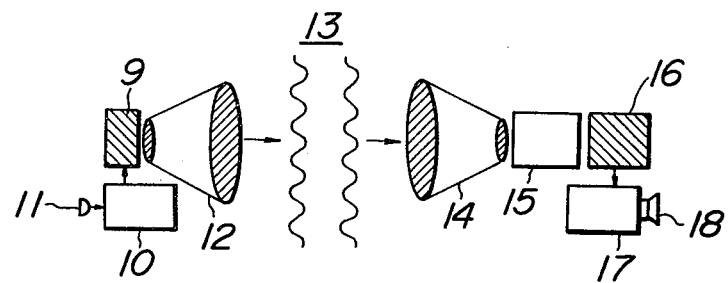
FIGS. 8, 9 and 10 are the block diagrams showing respectively examples of structures of various kinds of equipments applied with the infrared-emitting apparatus according to the present invention.

FIG. 8 shows an example of the outlined configuration of the infrared communication system of the above mentioned kind. In FIG. 8, an infrared generator 9 containing a magneto-infrared-emitting diode according to the present invention is supplied with an audio current derived from a microphone 11 through a low frequency amplifier 10, and the infrared radiation which is intensity-modulated by the audio current is sent into a light transferring medium 13 through a sending optical system 12, whilst the infrared radiation received through the medium 13 is supplied through a receiving optical system 14 to a photon-amplifier 15, which is fed with a pumping signal, and amplified therein, and then demodulated by an infrared detector 16, so as to reproduce an audio signal to be applied to a loudspeaker 18 through another low frequency amplifier 17.

(b) Infrared Range Finder

Figure 9:
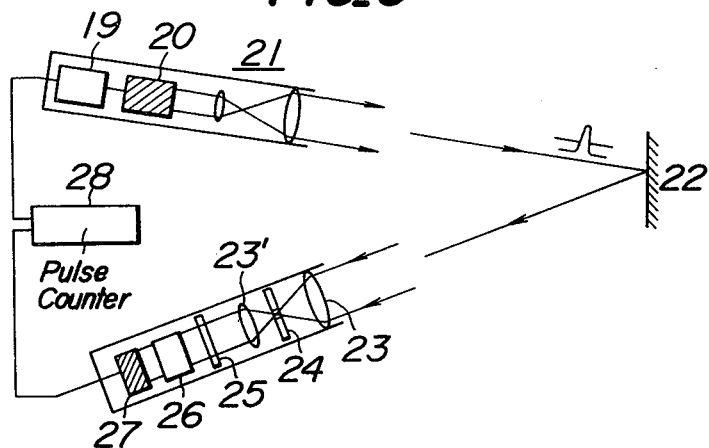

It is possible to provide an infrared range finder being usable night and day, that is, a so-called infrared laser radar by employing the above mentioned infrared radiations having wavelengths from 8 to 14 $\mu$m which is hardly attenuated in the atmosphere. FIG. 9 shows an example of the outlined configuration of the infrared range finder of the above kind. In FIG. 9, a pulsed infrared radiation emitted from a magneto-infrared-emitting diode 20 which is supplied with a large pulse current derived from a pulse generator 19 is reformed into an infrared parallel beam by a germanium lens system 21, so as to irradiate a body 22 thereby, whilst an infrared radiation reflected by the body 22 is catched by a receiving telescope composed as follows.

That is, the pulsed infrared radiation received through two germanium lens systems 23 and 23', between which a slit 24 is inserted, is collected into a narrow-band optical filter, so as to remove the background noise intermixed thereinto in the atmosphere, and then, after the amplification by a photon amplifier 26, it is converted into a pulsive electric signal, which controls a stroboscope pulse counter 28, so as to obtain a distance between this range finder and the body 22 from the number of strobo-pulses which is counted during a time duration elapsing after the large pulse current derived from the pulse generator 19 is applied thereto and until the converted pulse electric signal is applied thereto. Besides, the shape of the body 22 or the lay of the land which resembles thereto can be discriminated by comparing the waveform of the pulsed infrared radiation reflected by the body 22 and the waveform of the transmitted pulse infrared radiation, so that the above infrared range finder can be utilized for the laser radar which can be substituted for an electromagnetic wave radar. It is preferable to employ $Hg_{0.8}Cd_{0.2}Te$ from which an infrared radiation having a wavelength of 12.4 μm can be emitted, for the above range finder or the laser radar.

(c) Infrared Microscope

Figure 10:
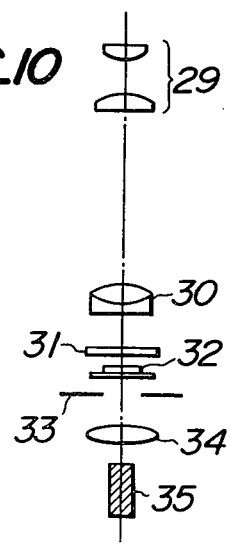

The magneto-infrared-emitting diode according to the present invention can be effectively employed for an infrared emitting device used in an infrared microscope for observing the internal structure, the lattice defects and the like of various materials, for instance, a semiconductor or a metal by utilizing the strong permeability of the infrared radiation, so as to realize a compact and simply-arranged infrared microscope. However, the infrared radiations having wavelength longer than 1.2 μm is not only visible, but also undetectable by the conventional infrared photograph film. So that, as shown in FIG. 10, an infrared radiation, which is emitted from an infrared-emitting equipment 35 containing the magneto-infrared-emitting diode according to the present invention, is collected upon a material 32 to be observed by a germanium lens 34 and an iris 33, and a portion of the infrared radiation which passes through the material 32 is observed with the eye or is photographed through an object lens 30 formed of a conventional magnifying and focussing lens system and an eye lens 29 after the conversion to a visible ray by a wavelength-converting filter 31, so as to compose the infrared microscope.

As is apparent from the above explanation, it is possible according to the present invention to realize a compact and simply-constructed magneto-infrared-emitting diode or an infrared laser diode which can be operated at room temperature by applying a magnetic field generated by a permanent magnet upon a semiconductor plate and further supplying a current thereto, and hence it is possible also to provide an extremely simply constructed and readily treated infrared emitting apparatus with remarkably distinct benefits.

What is claimed is:

1. A magneto-infrared-emitting diode formed of a plate of an intrinsic semiconductor having a narrow energy gap which does not exceed substantially 0.6 eV, said semiconductor being equipped with no injection electrode and including:
   a magnet for applying a magnetic field upon said magneto-infrared-emitting diode in parallel with said plate, and
   a current source for supplying a current to said magneto-infrared-emitting diode in parallel with said plate as well as orthogonal to said magnetic field so as to emit an infrared radiation of a wavelength greater than 2.1 μm from said magneto-infrared-emitting diode substantially perpendicular to said plate at least at room temperature.

2. A magneto-infrared-emitting diode as claimed in claim 1, wherein said diode is operated in a temperature range from room temperature to liquid nitrogen temperature.

3. A magneto-infrared-emitting diode as claimed in claim 1, wherein said intrinsic semiconductor is selected from a group consisting of $Pb_{1-x}Sn_xSe$, InAs and $Bi_{1-x}Sb_x$.

4. A magneto-infrared-emitting diode as claimed in claim 3, wherein a wavelength of said infrared radiation emitted from said magneto-infrared-emitting diode can be varied by selecting a component composition ratio x of said semiconductor.

5. A magneto-infrared-emitting diode as claimed in claim 1, wherein said current is supplied to said plate through electrodes fitted respectively on both ends of said plate by ohmic contacts.

6. A magneto-infrared-emitting diode as claimed in claim 1, wherein said current source is formed of a microphone for deriving an audio information current therefrom as said current to be supplied to said magneto-infrared-emitting diode.

7. A magneto-infrared-emitting diode as claimed in claim 1, wherein said infrared radiation emitted from said magneto-infrared-emitting diode can be intensity-modulated by modulating said current to be supplied to said magneto-infrared-emitting diode.

8. An infrared communication equipment comprising at least two magneto-infrared-emitting diodes as claimed in claim 1, wherein one of said magneto-infrared emitting diodes is used for generating an infrared radiation to be transmitted and the other of said magneto-infrared-emitting diodes is used for detecting an infrared radiation to be received by using a photo-magneto-electric effect in a reverse process so as to operate said infrared communication equipment at a wavelength between 2 and 25 μm at room temperature.

9. An infrared range finder comprising at least two magneto-infrared-emitting diodes as claimed in claim 1, wherein one of said magneto-infrared-emitting diodes is used for generating an infrared radiation to irradiate a body to be measured and the other of said magneto-infrared-emitting diodes is used for detecting an infrared radiation to be reflected from said body.

10. An infrared microscope comprising at least one magneto-infrared-emitting diode as claimed in claim 1, wherein said magneto-infrared-emitting diode is used for irradiating a material to be observed through an optical system.

* * * * *